United States Patent [19]
Auffret et al.

[11] Patent Number: 5,307,366
[45] Date of Patent: Apr. 26, 1994

[54] LOGIC FUNCTION GENERATOR USING AN OPTICAL TRANSPOSITION IN A DISTRIBUTED FEEDBACK LASER DIODE

[75] Inventors: René Auffret, Perros Guirec; Patrice Pottier; Mouhammad J. Chawki, both of Lannion; Georges Claveau, Camlez, all of France

[73] Assignee: France Telecom Etablissement Autonome de Droit Public, Paris, France

[21] Appl. No.: 955,024

[22] Filed: Oct. 1, 1992

[30] Foreign Application Priority Data

Oct. 16, 1991 [FR] France .................. 91 12763

[51] Int. Cl.$^5$ .................................. H01S 3/10
[52] U.S. Cl. .............................. 372/96; 372/8
[58] Field of Search ............ 372/8, 92, 96; 385/1, 385/11, 14, 31; 307/311

[56] References Cited

U.S. PATENT DOCUMENTS

| | | | |
|---|---|---|---|
| 4,835,779 | 5/1989 | Liou | 372/96 X |
| 4,873,690 | 10/1989 | Adams | 372/8 |
| 4,962,502 | 10/1990 | Adams | 372/8 |

OTHER PUBLICATIONS

Electronics Letters, vol. 25, No. 22, Oct. 26, 1989, pp. 1485–1486, H. Nobuhara, et al., "Optical Exclusive-or Operation Using Tunable Wavelength Conversion Laser Diode".
Electronic Letters, vol. 25, No. 20, Sep. 28, 1989, pp. 1360–1362, K. Inoue, et al., "Wavelength Conversion for FM Light Using Light Injection Induced Frequency Shift in DFB-LD".
Patent Abstracts of Japan, vol. 13, No. 23 (E-705), Jan. 19, 1989, & JP-A-2 63 226, 990, Sep. 21, 1988, H. Imai, "Light Logical Device".
Patent Abstracts of Japan, vol. 14, No. 269 (P-1059), Jun. 11, 1990, & JP-A-2 077 030, Mar. 16, 1990, M. Jinno, et al., "Optical Logic Circuit".
IEEE Journal of Quantum Electronics, vol. 24, No. 11, Nov. 1988, pp. 2153–2159, H. Kawaguchi, et al., "Tunable Optical-Wavelength Conversion Using an Optically Triggerable Multielectrode Distributed Feedback Laser Diode".

*Primary Examiner*—John D. Lee
*Attorney, Agent, or Firm*—Oblon, Spivak, McClelland, Maier & Neustadt

[57] ABSTRACT

Logic function generator using an optical transposition in a distributed feedback laser diode. It comprises sources (LD1, LD2) of synchronous digital optical signals having the same rate, an optical coupler (10) receiving said signals and supplying an optical signal, a distributed feedback laser diode (LD3) into which is injected said optical signal, means (24) for the electrical polarization of said laser diode enabling the latter to supply a signal, whose optical frequency varies as a function of the optical power of the injected signal, an optical filter (12) which receives said signal and which is frequency tunable and control means (28) for the said filter. The latter supplies a signal which is a logic function of the signals of the sources. Application to optical calculation.

6 Claims, 3 Drawing Sheets

LOGIC FUNCTION GENERATOR USING AN OPTICAL TRANSPOSITION IN A DISTRIBUTED FEEDBACK LASER DIODE

BACKGROUND OF THE INVENTION

1. Field of the Invention

The present invention relates to an optical logic function generator.

It more particularly applies to the production of optical switching devices and optical calculating devices.

2. Discussion of the Background

A device making it possible to perform the logic EXCLUSIVE-OR operation in optical form is known from document (1) Optical EXCLUSIVE-OR Operation Using Tunable Wavelength Conversion Laser Diode, H. NOBUHARA, K. KONDO and S. YAMAKOSHI, Electronics Letters, Oct. 26,1989, vol. 25, no. 22, pp. 1485/6. This known device suffers from the disadvantages of using a laser diode, which has a very complicated construction (said laser diode having four control electrodes and a saturable absorbent) and it is only able to carry out one logic operation (EXCLUSIVE-OR).

SUMMARY OF THE INVENTION

The present invention aims at obviating the aforementioned disadvantages by proposing an optical logic function generator, which can be produced with a distributed feedback laser diode of a standard type having one or two polarizing electrodes and which, unlike in the case of the device described in document (1), is able to supply at the output a logic function in optical form, which is reconfigurable, i.e. it is possible to choose said logic function from among several logic functions obtainable with the generator according to the invention.

To this end, the generator uses an optical transposition in the distributed feedback laser diode thereof and a frequency tunable optical filter.

More specifically, the present invention relates to an optical logic function generator, characterized in that it comprises:

a plurality of sources of digital optical signals, which are synchronous and have the same rate, an optical coupler receiving at the input the signals emitted by the sources and which supplies at the output an optical signal resulting from the coupling of said signals emitted by the sources, a distributed feedback laser diode, into 7hose active layer is injected the optical signal supplied by the optical coupler, means for the electrical polarization of said laser diode enabling the latter to supply at the output a signal, whose optical frequency varies as a function of the optical power of the signal injected into the laser diode, an optical filter, which is frequency tunable and receives at the input the signal supplied by the laser diode and means for the control of the optical filter enabling the latter to select one of the optical frequencies of the output signal of the laser diode and thus supply a digital optical signal, which is a logic function of the signals supplied by the sources.

For a satisfactory operation of the logic &unction generator according to the invention, it is preferable for the polarization direction of each of the digital optical signals reaching the input of the distributed feedback laser diode to be in the polarization plane of said laser diode.

Preferably, said distributed feedback laser diode has two polarizing electrodes. It is then easy to choose the two electrical currents, respectively making it possible to polarize the two electrodes in such a way that the laser diode is monomodal.

The optical filter of the generator according to the invention can be a tunable, Fabry Perot interferometer. However, preferably, said optical filter is an auxiliary distributed feedback laser diode, which is equipped with means able to polarize said auxiliary laser diode below its threshold current. Therefore there are less optical losses than with the Fabry Perot interferometer.

Finally, the number of digital optical signal sources can be two, the laser diode receiving said signals by means of the coupler thus emitting signals at three different optical frequencies, the optical filter then supplying at the output, as a function of that of the three frequencies which is selected, one of the logic AND, NAND and EXCLUSIVE-OR functions in optical form.

BRIEF DESCRIPTION OF THE DRAWINGS

The invention is described in greater detail hereinafter relative to non-limitative embodiments and the attached drawings, wherein.

DETAILED DESCRIPTION OF THE PREFERRED EMBODIMENTS

Figure 1:
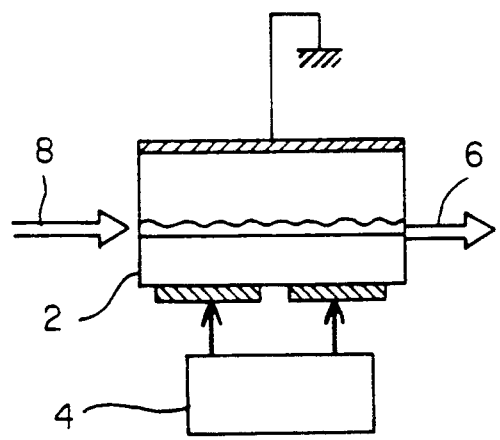
FIG. 1 shows the principle of an optical transposition by the drift of the emission &requency of a distributed feedback laser diode.

A description will now be given with the aid of FIG. 1 of the principle of optical transposition by the drift of the emission frequency of a distributed feedback laser diode. Such an optical transposition is used in the present invention and is referred to in the document (2) Wavelength Conversion for FM Light Using Light Injection Induced Frequency Shift in DFB-LD, K. INOUE and N. TAKATO, ELECTRONICS LETTERS, Sep. 28, 1989, vol. 25, no. 20, pp. 1360 to 1362.

Having a distributed feedback laser diode 2 with e.g. two polarizing electrodes, said laser diode 2 is provided with electrical polarization means 4 for applying to said electrodes constant polarizing currents making it possible to make the laser diode 2 monomodal and obtain a laser emission.

The laser diode then emits an output or light beam 6, whose wavelength is designated lo (stationary or centre wavelength of the laser diode). If a light beam 8 is injected into the active layer of the laser diode 2, there is a drift of the optical frequency of the output beam 6.

If the optical power of the incident beam 8 is modulated between zero and a maximum value Pm, then the optical frequency of the output beam 6 varies continuously between two values, the lowest corresponding to the centre wavelength lo.

Figure 2:
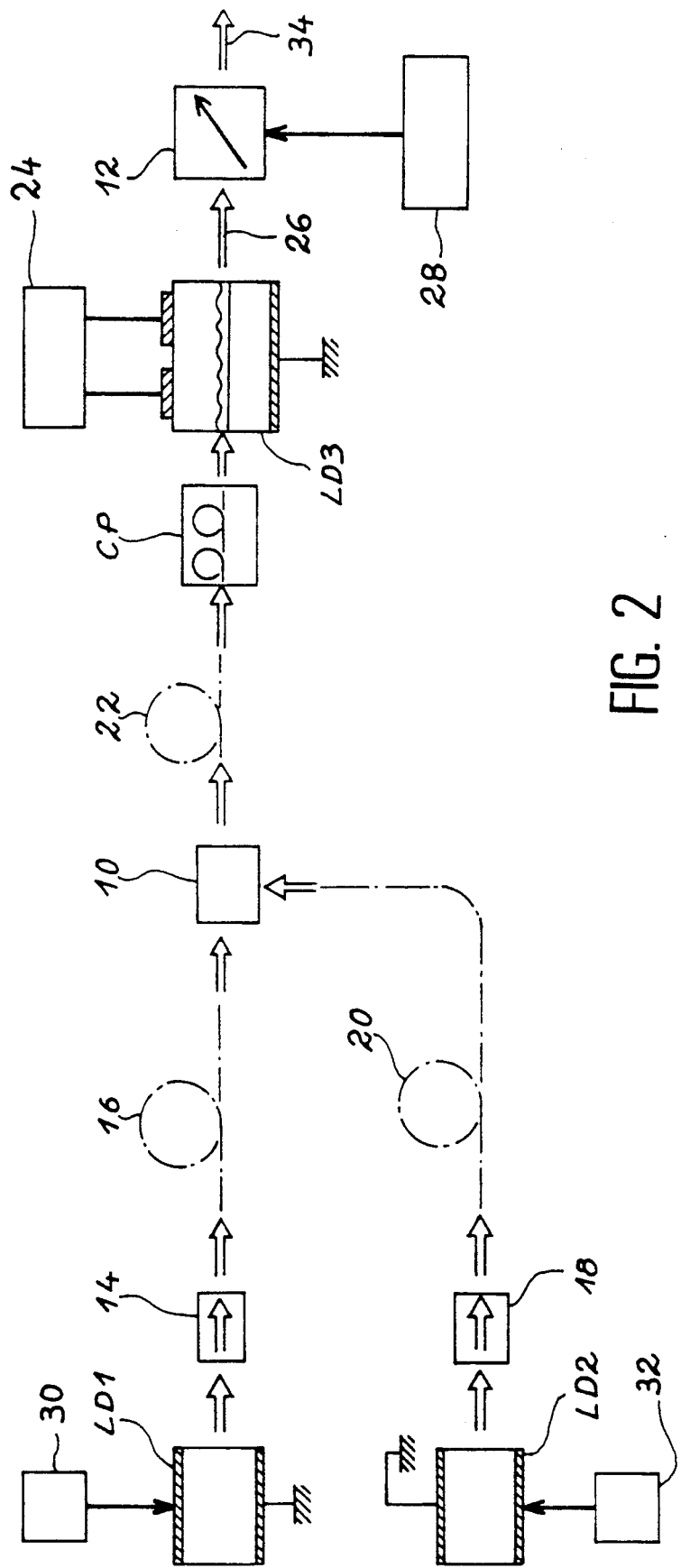
FIG. 2 is a diagrammatic view of a special embodiment of the logic function generator according to the invention.

FIG. 2 diagrammatically shows a special embodiment of the logic function generator according to the invention. The generator shown in FIG. 2 comprises two monomodal laser diodes LD1 and LD2, an optical coupler 10 with two inputs and one output (so-called 2 to 1 coupler), a distributed feedback laser diode LD3 and a frequency tunable optical filter 12.

The laser diode LD1, at whose output is positioned an optical isolator 14, is connected by an optical fibre 16 to an input of the optical coupler 10. In the same way, the laser diode LD2, at whose output is positioned an optical isolator 18, is connected by an optical fibre 20 to the other input of the optical coupler 10.

The light which can be supplied by the output of the optical coupler 10 is supplied to the laser diode LD3 via an optical fibre 22 and is injected into the active layer of said laser diode LD3.

The laser diode LD3, which has two polarizing electrodes, is equipped with control means 24 for respectively supplying to said electrodes two constant polarizing currents chosen in such a way that the laser diode LD3 is monomodal and supplies a laser beam 26 at the output.

In place of the laser diode LD3 with two electrodes, it would be possible to use a distributed feedback laser diode having a single polarizing electrode, but it would then be necessary to make it undergo an anti-reflection treatment in order to make it monomodal (in the case that it was not).

For as long as the laser diode LD3 receives no optical signal from the optical coupler 10, the wavelength of the output optical beam 26 is the centre wavelength LO of the laser diode LD3. The optical frequency corresponding to said wavelength LO is designated FO.

The optical filter 12, which is frequency tunable, is positioned at the output of the laser diode LD3 and selects one optical frequency from among the optical frequencies of the optical signals liable to be supplied by the laser diode LD3. The optical filter 10 is controlled by appropriate means 28.

The laser diodes LD1 and LD2 are respectively controlled by electrical signal generators 30 and 32. In the embodiment described, they are pseudo-random digital signals, which are synchronous and have the same rate.

Thus, the laser diodes LD1 and LD2 respectively emit digital optical signals S1 and S2, which are synchronous and have the same rate. These optical signals are mixed by the optical coupler 10 and are simultaneously injected into the active layer of the laser diode LD3.

It is pointed out that a polarization controller CP is located at the input of the laser diode LD3 to give the signals S1 and S2 leaving the optical fibre 22 a polarization direction in the polarization plane of the laser diode LD3 (plane of the active layer of said laser diode LD3).

Each of the optical signals S1 and S2 is a sequence of high levels (logic levels 1) and low levels (logic levels zero).

Figure 3:
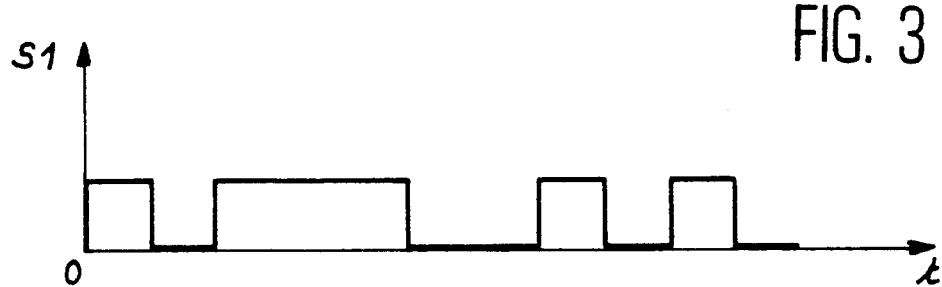
FIG. 3 is an example of a digital optical signal which can be supplied by one of the two sources of the generator diagrammatically shown in FIG. 2.

An example of a digital optical signal S1 supplied by the laser diode LD1 is shown in FIG. 3. In the same way, an example of a digital optical signal S2 supplied by the laser diode LD2 is shown in FIG. 4.

Figure 4:
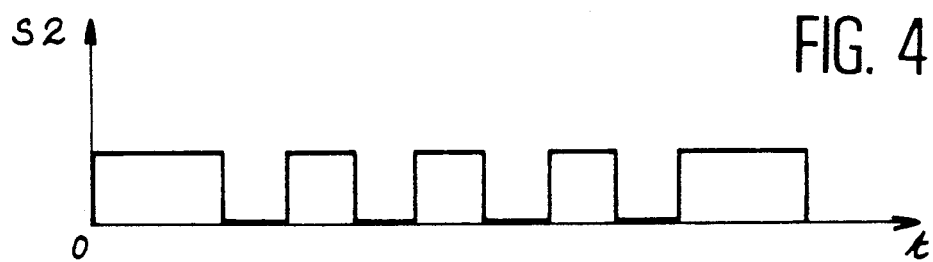
FIG. 4 shows an example of a digital optical signal which can be supplied by the other source of said generator.

The time axes shown in FIGS. 3 and 4 have the same origin 0.

FIG. 3 shows the variations, as a function of the time t, of the optical power supplied by the laser diode LD1 and, in FIG. 4, the variations, as a function of the time t, of the optical power supplied by the laser diode LD2. It is clear that the optical power injected into the laser diode LD3 varies in time.

Three cases occur:
a) two logic levels 0 respectively from the laser diodes LD1 and LD2 simultaneously arrive at the laser diode LD3;
b) a logic level 0 from one of the laser diodes LD1 and LD2 and a logic level 1 from the other of said laser diodes LD1 and LD2 simultaneously reach the laser diode LD3; and
c) two logic levels 1 respectively from the laser diodes LD1 and LD2 simultaneously reach the laser diode LD3.

In case a), the optical power injected into the laser diode LD3 is zero. Consequently the optical frequency of the optical beam 26 emitted by said laser diode LD3 is the centre frequency FO of the laser diode LD3.

In case b), the optical power injected into the laser diode LD3 is not zero and the frequency of the optical signal supplied by the laser diode LD3 drifts to a value F1 exceeding FO, Finally, in case c), the optical power injected into the laser diode LD3 is the maximum optical power obtainable with the signals S1 and S2.

The optical frequency of the optical signal 26 supplied by the laser diode LD3 drifts, in case c), to a value F2 exceeding F1.

Thus, at the output of the laser diode LD3, a digital optical signal is obtained, whose optical frequency F passes successively from one of the values F0, F1 and F2 to another of said values during time t.

Figure 5:
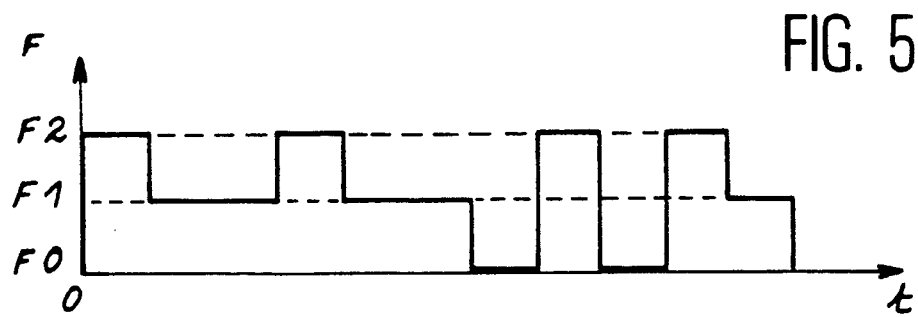
FIG. 5 illustrates the frequency response of the distributed feedback laser diode of the generator of FIG. 2, when said laser diode receives the signals shown in FIGS. 3 and 4.

FIG. 5 shows the frequency response F, as a function of the time t, of the laser diode LD3, said frequency response corresponding to the signals S1 and S2 given in exemplified manner in FIGS. 3 and 4.

The origin 0 of the time axis t of FIG. 5 coincides with the origin of the time axis of FIGS. 3 and 4.

The truth table given at the end of the present description and which corresponds to FIG. 5, shows the digital optical signal 34 obtained at the output of the frequency tunable optical filter 12 as a function of whether said optical filter selects the frequency FO, the frequency F1 or the frequency F2.

This truth table shows that the optical filter 12 makes it possible to select one of the three logic functions AND, NAND and EXCLUSIVE-OR (XOR).

More specifically, when the frequency FO is selected, the digital optical signal 34 supplied by the optical filter 12 corresponds to the logic function NAND. When the frequency F1 is selected, said digital optical signal 34 corresponds to the logic function XOR. Finally, when the frequency F2 is selected said digital optical signal 34 corresponds to the logic function AND.

Thus, an optical logic function generator is provided which is unique in that said logic function is reconfigurable, i.e. can be chosen from among several logic functions in accordance with the optical frequency selected by the frequency tunable optical filter 12. The latter can be a tunable Fabry Perot interferometer and an example thereof is diagrammatically shown in FIG. 6.

Figure 6:
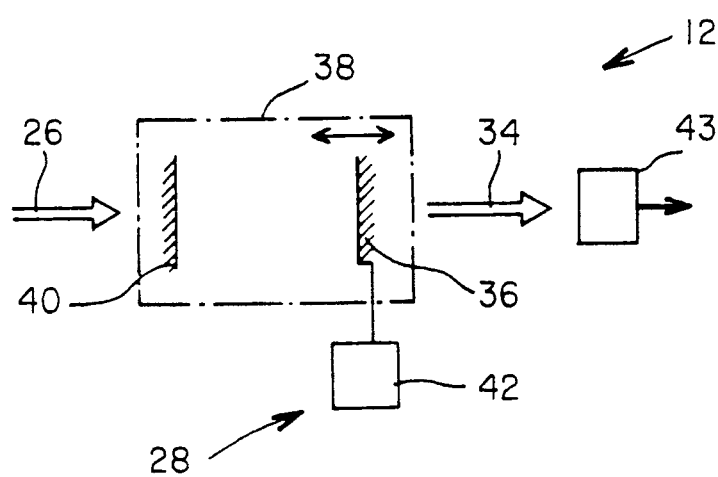
FIG. 6 shows a tunable Fabry Perot interferometer, which can be used as the optical filter in said generator.

One of the two mirrors of said Fabry Perot interferometer 38 designated 36 and shown in FIG. 6 is displaceable in translation relative to the other mirror 40 of said interferometer 38. This translation makes it possible to regulate the distance between the two mirrors 36 and 40 and therefore select one optical &requency from among those of the incident light 26. The displacement in translation is controlled by appropriate means 42 e.g. having piezoelectric blocks.

The signal 34 leaving the interferometer 38 can then be detected by a photodiode 43.

In another embodiment, the frequency tunable optical filter 12 is constituted by an auxiliary distributed feedback laser diode 44 diagrammatically shown in FIG. 7 and which is polarized below its threshold current by appropriate means 46.

Figure 7:
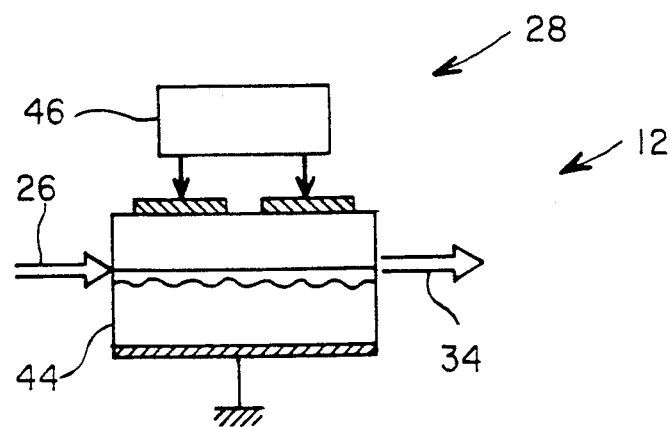
FIG. 7 shows an auxiliary distributed feedback laser diode, which can also be used as the optical filter in the generator of FIG. 2.

In the embodiment shown in FIG. 7, the auxiliary laser diode 44 has two polarizing electrodes and it is by regulating the value of the polarizing currents respectively supplied by the appropriate means 46 that it is possible to choose the value of the frequency selected by said auxiliary laser diode 44 &/rming the optical filter.

In connection with such a laser diode forming an optical filter reference can e.g. be made to document (3) French patent application 90 06 926 of May 6, 1990 and entitled "Bidirectional Transmission System with Identical Laser Components".

The optical logic function generator according to the invention is not limited to logic functions with two inputs (example shown in FIG. 2).

It is possible to have a logic function generator according to the invention able to produce logic functions with N inputs (i.e. N logic variables), N being an integer at least equal to 2. In this case, use is made of N laser diodes of the type of laser diodes LD1 and LD2 and which are controlled in the same way as the latter, as well as an optical coupler having N inputs and one output. Then, the output states of the laser diode LD3 are distributed over N optical frequencies.

The present invention makes it possible to obtain optical logic gates, whose operating "speed" (or switching speed) is at least 1.5 GHz.

| TRUTH TABLE | | | | |
|---|---|---|---|---|
| LD1 | LD2 | F0 | F1 | F2 |
| 0 | 0 | 1 | 0 | 0 |
| 0 | 1 | 0 | 1 | 0 |
| 1 | 0 | 0 | 1 | 0 |

| -continued | | | | |
|---|---|---|---|---|
| TRUTH TABLE | | | | |
| LD1 | LD2 | F0 | F1 | F2 |
| 1 | 1 | 0 | 0 | 1 |

We claim:
1. Optical logic function generator, comprising:
a plurality of sources of digital optical signals, which are synchronous and have the same rate,
an optical coupler receiving at the input the signals emitted by the sources and which supplies at the output an optical signal resulting from the coupling of said signals emitted by the sources,
a distributed feedback laser diode, into whose active layer is injected the optical signal supplied by the optical coupler,
means for providing constant electrical polarization of said laser diode enabling the latter to supply at the output a signal, whose optical frequency varies as a function of the optical power of the signal injected into the laser diode,
an optical filter, which is frequency tunable and receives at the input the signal supplied by the laser diode and
means for the control of the optical filter enabling the latter to select one of the optical frequencies of the output signal of the laser diode and thus supply a digital optical signal, which is a logic function of the signals supplied by the sources.
2. Generator according to claim 1, characterized in that the polarization direction of each of the digital optical signals reaching the input of the distributed feedback laser diode is in the polarization plane of said laser diode.
3. Generator according to claim 1, characterized in that said distributed feedback laser diode has two polarizing electrodes.
4. Generator according to claim 1, characterized in that the optical filter is a tunable Fabry Perot interferometer.
5. Generator according to claim 1, characterized in that the optical filter is an auxiliary distributed feedback laser diode, which is equipped with means able to polarize said auxiliary laser diode below its threshold current.
6. Generator according to claim 1, characterized in that the number of sources of digital optical signals is 2, the laser diode, which receives said signals via the coupler, thus emitting signals with three different optical frequencies, the optical filter then supplying at the output, as a function of which of the three frequencies is selected, one of the logic functions AND, NAND and EXCLUSIVE-OR in optical form.

* * * * *